United States Patent [19]

Kuphal et al.

[11] Patent Number: 4,661,175
[45] Date of Patent: Apr. 28, 1987

[54] METHOD OF MAKING INGAASP AND INGAAS DOUBLE HETERO-STRUCTURE LASERS AND LEDS

[75] Inventors: Eckart Kuphal; Herbert Burkhard, both of Darmstadt, Fed. Rep. of Germany

[73] Assignee: Siemens Aktiengesellschaft, Berlin and Munich, Fed. Rep. of Germany

[21] Appl. No.: 741,744

[22] Filed: Jun. 6, 1985

[30] Foreign Application Priority Data

Jun. 7, 1984 [DE] Fed. Rep. of Germany ....... 3421215

[51] Int. Cl.$^4$ .......................................... H01L 21/208
[52] U.S. Cl. .................... 148/171; 29/569 L; 29/576 E; 148/172; 357/17; 372/45
[58] Field of Search ................. 148/171, 172; 357/17; 29/569 L, 576 E; 372/45

[56] References Cited

U.S. PATENT DOCUMENTS

| | | | |
|---|---|---|---|
| 4,342,148 | 8/1982 | Springthorpe et al. | 29/569 L |
| 4,425,650 | 1/1984 | Mito et al. | 357/17 X |
| 4,468,850 | 9/1984 | Liau et al. | 29/569 L |
| 4,480,331 | 10/1984 | Thompson | 372/45 |
| 4,496,403 | 1/1985 | Turley | 148/171 |
| 4,566,171 | 1/1986 | Nelson et al. | 29/569 L |

OTHER PUBLICATIONS

Y. Noguchi, K. Takahei, Y. Suzuki, and H. Nagai, *Japanese Journal of Appl. Phys.*, vol. 19, No. 12, Dec. 1982, pp. L 759 through L 762.

S. H. Groves and M. C. Plonko, *Appl. Phys. Letters*, vol. 38, No. 12, Jun. 1981, pp. 1003 through 1004.

*Primary Examiner*—George T. Ozaki
*Attorney, Agent, or Firm*—Hill, Van Santen, Steadman & Simpson

[57] ABSTRACT

A method is provided for manufacturing a double hetero-structure of InGaAsP/InP, or, alternatively of InGaAs/InP, for use in lasers and LEDs by means of liquid phase epitaxy. The resulting structures emit optical radiation up to a wavelength of about 1.7 $\mu$m. As a result of growing the InP cover layer from an Sn-In-P solution, the meltback of the active layer at gap wavelengths $\geq 1.5$ $\mu$m is avoided, and, thus, no anti-meltback layer is needed. By employing an inverted format for the layer structure with respect to the doping of a starting p-InP substrate, the necessarily highly n-doped InP cover layer has the correct conductivity type. The so-produced double hetero-structures are composed of only three epitaxial layers.

18 Claims, 5 Drawing Figures

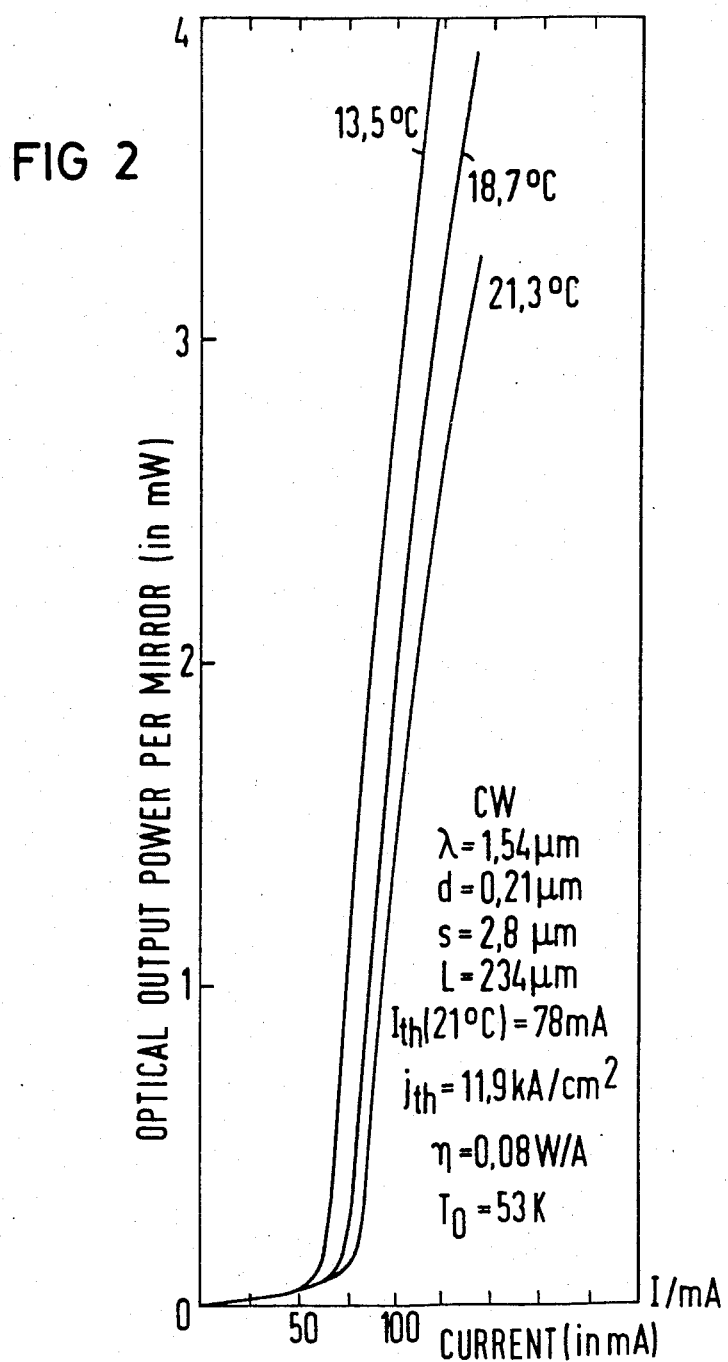

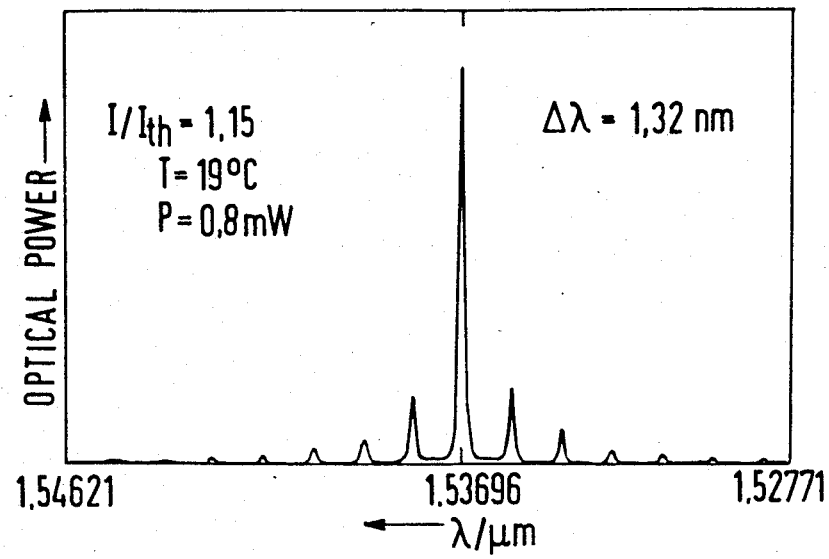
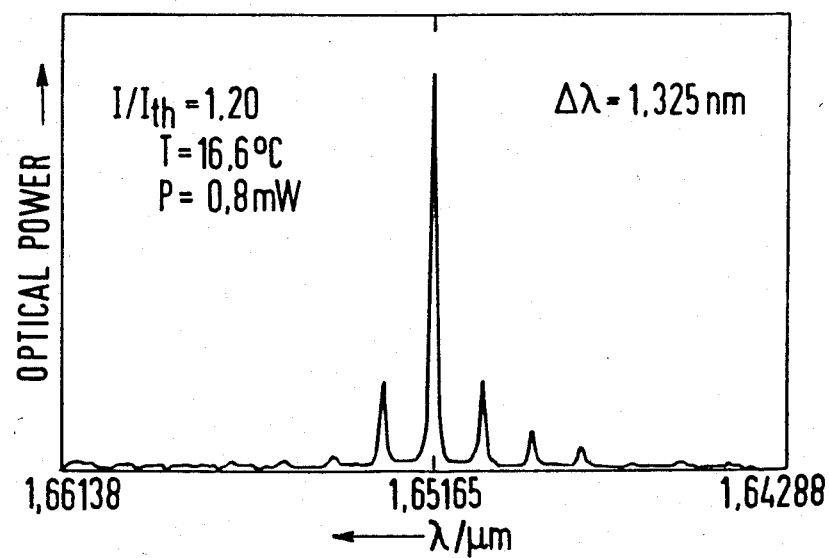

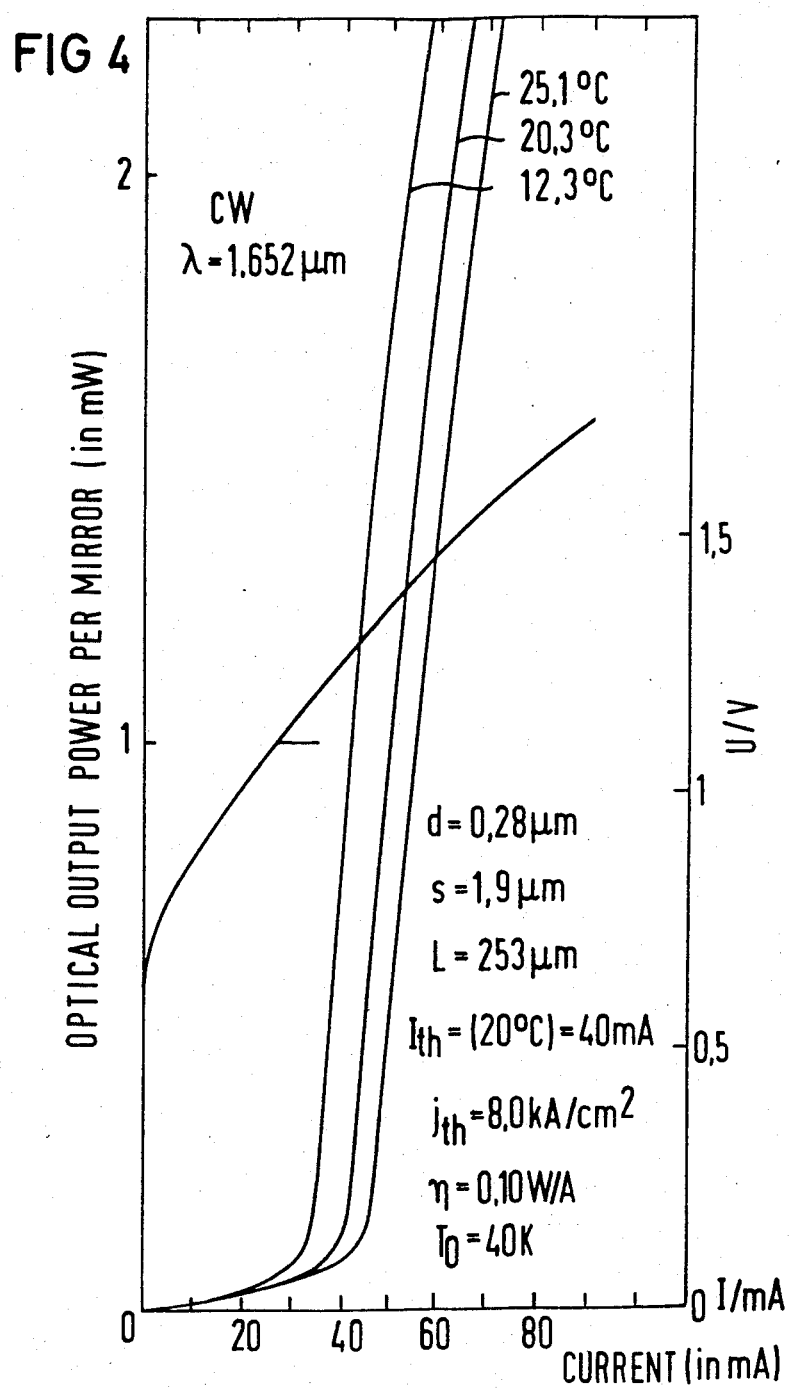

METHOD OF MAKING INGAASP AND INGAAS DOUBLE HETERO-STRUCTURE LASERS AND LEDS

BACKGROUND OF THE INVENTION

1. Field of the Invention

This invention lies in the field of lasers and light emitting diodes (LEDs), and, more particularly of InGaAs and InGaAsP lasers and LEDs and methods for their manufacture.

2. Prior Art

Conventional InGaAsP/InP lasers and light emitting diodes (LEDs) suitable for use as continuous wave (CW) optical transmitters over the wavelength ($\lambda$) range extending from about 1.2 to 1.5 microns ($\mu$m) are constructed on an n-doped, (100)-oriented InP crystalline substrate. The layer structure is successively composed of an n-doped InP buffer layer, of an n-conductive or p-conductive active InGaAsP layer of the corresponding gap wavelength, and of a p-doped InP cover layer. Such cover layer, in most instances, is also followed by a p+-doped InGaAs(P) contact layer in order to reduce the contact resistance. These lasers and LEDs are presently preferably produced by means of liquid phase epitaxy.

The optical fibers employed in optical communications technology in fact have their attenuation minimum in the wavelength ($\lambda$) range extending from about 1.5 to 1.7 $\mu$m. In order to produce lasers and LEDs which emit in this important wavelength range, it is necessary to correspondingly increase the gap wavelength $\lambda_g$ of the active InGaAsP layer. The highest gap wavelength $\lambda_g$ in the system InGaAsP is reached in the limit case $In_{0.53}Ga_{0.47}As$ when $\lambda_g$ is about 1.65 $\mu$m. The emission wavelength $\lambda$ of the ternary laser or of the ternary LED, lies in the range from about 1.65 through 1.70 $\mu$m, depending especially on the doping, the injection current, and the temperature. Given the traditional layer build-up by means of liquid phase epitaxy (LPE), however, the following difficulty occurs when $\lambda_g$ is greater than or equal to 1.5 $\mu$m: The active InGaAs(P) layer is partially melted back by the subsequent Jn-P solution that serves for the growth of the InP layer.

In order to avoid this melt-back effect, a quaternary anti-meltback layer having a gap wavelength below that of the active layer is grown between the active layer and the cover layer, as described by Y. Noguchi, K. Takahei, Y. Suzuki, and H. Nagai in the Japanese Journal of Appl. Phys., Vol. 19, No. 12, Dec. 1982, pages L 759 through L 762. This so-called anti-meltback layer, however, reduces the confinement factor of the waveguide and must therefore be selected so as to be extremely thin (about 0.1 $\mu$m). This additional, extremely thin layer makes the LPE process more complicated, and, thus, less reproducible.

S. H. Groves and M. C. Plonko (Appl. Phys. Letters, Vol. 38, No. 12, June 1981, pages 1003 through 1004) have shown that meltback-free growth of InP on (100)-oriented $In_{0.53}Ga_{0.47}As$ (and, thus, on InGaAsP as well) is possible from an Sn-In-P solution. The InP layer thus produced, however, is highly n-doped. It is therefore unsuitable for use as a cover layer for the known laser and LED structures based on n-InP substrates, since a p-doped InP cover layer is thereby required.

It is also known that the structuring of the epitaxial layer sequence in the form of a so-called "mushroom" structure can be carried out in order to produce an index-guided laser with a low threshold current and a high optical output power, as described by H. Burkhard and E. Kuphal in the Japanese Journal of Appl. Phys., Vol. 22, No. 11, Nov. 1983, pages L 721 through L 723. The "mushroom" structure lasers have electrical and optical properties which are equivalent to the usually produced so-called "buried hetero-structure lasers" (BH-lasers), but have the advantage of a far simpler technology, since only one epitaxial process is required in contrast to the two epitaxial processes required for BH-lasers.

BRIEF SUMMARY OF THE INVENTION

More particularly, this invention relates to a new and very useful method for making Indium Gallium Arsenide Phosphide (InGaAsP) and Indium Galium Arsenide (InGaAs) double heterostructures for lasers and light emitting diodes (LEDs). Such method provides structures which are substantially uniform, which are grown by means of liquid phase epitaxy (LPE), which emit optical radiation in a wavelength ($\lambda$) range from about 1.2 to 1.7 microns ($\mu$m), and which contain no anti-meltback layer.

This invention further relates to the new and very useful lasers and LEDs which result from the practice of such method.

An object of the present invention is to provide improved InGaAsP and InGaAs double hetero-structures for lasers and LEDs which have an optical radiation emission wavelength ($\lambda$) range extending from about 1.2 to 1.7 m.

A further object is to provide lasers and LEDs of the classes above indicated which are grown by liquid phase epitaxy.

A further object is to provide a process for making structures for lasers and LEDs of the above indicated type wherein the active layer (of either quaternary InGaAsP or ternary InGaAs) is deposited by means of liquid phase epitaxy on a (100)-oriented crystalline p-InP substrate without an anti-meltback layer.

The anti-meltback layer is inventively avoided in that the meltback-free growth of InP from an Sn-In-P solution on the active InGaAsP, or, alternatively, InGaAs, layer is combined with an inverted layer format based on a p-conductive substrate. Consequently, the n-doped InP cover layer grown from the Sn-In-P solution has the correct conductivity type.

Other and further objects, aims, purposes, features, advantages, variations, embodiments, equivalents, and the like will be apparent to those skilled in the art from the teachings of the present specification taken in combination with the accompanying drawings.

BRIEF DESCRIPTION OF THE DRAWINGS

In the drawings:

FIG. 2 shows the relationship between applied current in milliamperes and optical output power per mirror in milliwatts for various temperatures for an InGaAsP laser structure of the present invention;

FIG. 3 is a plot of the relationship between wavelength and optical power, thereby providing the emission spectrum of such an InGaAsP structure as shown in FIG. 2.

FIG. 4 is a graph similar to FIG. 2 but for an InGaAs structure of the present invention, this Figure also including the current-voltage characteristic curve for such structure; and FIG. 5 is a plot similar to FIG. 3 for such InGaAs structure as shown in FIG. 4.

DETAILED DESCRIPTION

Figure 1:
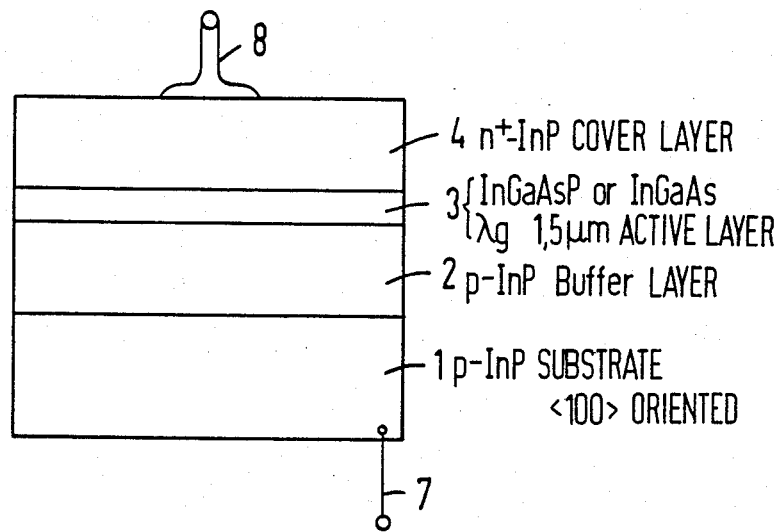
FIG. 1 is an enlarged diagrammatic vertical sectional view through one embodiment of a laser or a LED structure of the present invention.

The layers comprising a double hetero-structure laser structure, or LED structure, of this invention are as illustrated in FIG. 1. These layers are deposited by means of liquid phase epitaxy (LPE) in a temperature-controlled furnace or furnace sequence in a hydrogen ($H_2$) atmosphere from melt solutions. A p-doped InP buffer layer 2 is first deposited on a p-doped (100)-oriented InP substrate in order to create as undisturbed a transition as possible to the active layer 3. Next following there is deposited upon the buffer layer the active layer 3 of either InGaAsP having a gap wavelength $\lambda_g \gtrsim 1.5$ m, or, alternatively, of $In_{0.53}Ga_{0.47}As$ having a gap wavelength $\lambda_g = 1.65$ µm. Next following there is deposited upon the active layer 3 a cover layer 4 of $n^+$-InP. All three layers epitaxially grown and are lattice-matched. Electrodes or connections 7, 8 are provided.

The meltback of the active layer during the growth of the cover layer is negligibly slight since, first, the solubility of Ga and As in an Sn solution is about half as high as in an In solution given the same temperature. Second, given the same temperature, the solubility of InP in an Sn solution is significantly higher than in an In solution, so that the growth temperature of the Sn-In-P solution can be substantially reduced given the same growth rate of the cover layer. A growth temperature of about 700° C. given an In-P solution corresponds, for example, to a growth temperature of an Sn-In-P solution of about 470° C., this again decisively reducing the solubility of Ga and As. Third, as a result of super-saturation of the Sn-In-P solution, a high growth rate is achieved at the beginning of the growth of the cover layer, and, thus, the time during which a meltback of the active layer is possible is shortened.

The significant advantage thus arises in that, on the bases of the inventively inverted layer format and the omission of the anti-meltback layer, laser or LED structures can be produced with only three epitaxially grown layers, and the product lasers or LEDs emit optical radiation up to a wavelength ($\lambda$) of about 1.7 µm. Simply constructed, reliably reproducible, and, as a consequence, economically manufacturable, the product lasers and LEDs are thus also available for the wavelength ($\lambda$) range from about 1.5 µm through 1.7 µm.

A further advantage of the invention is provided in that, due to the inverted layer sequence, the p-contact with its high specific contact resistance ($\rho_c \approx 10^{-4} \Omega cm^2$) is situated on the large-area substrate side, whereas the n-contact with its far lower specific contact resistance ($\rho_c \approx 10^{-6} \Omega cm^2$) is situated on the epitaxial side which is structured low-area in comparison to the substrate side. The n-contact resistance is also additionally reduced in that the InP layer deposited from an Sn solution has a very high carrier density of $n = (3 \ldots 4) \times 10^{19} cm^{-3}$ and a very low specific resistance of $\rho \approx 3 \times 10^{-4} \Omega cm$. The overall ohmic resistance, and, thus, the power dissipation of a product laser or LED, becomes very low, given the format of the layer sequence according to the invention. An additional insertion of a contact layer of a material having a smaller energy gap than JnP composed of either InGaAsP or InGaAs between the cover layer and the contact for the purpose of reducing the contact resistance in the manner generally employed in the prior art is thus also superfluous In addition to a reduction in the number of epitaxial steps required in the manufacture in comparison to the BH laser structure, the invention further provides advantages by permitting a product layer structure to be formed into a "mushroom" laser structure so that the undercut of the mesa is precisely controllable, and, as a consequence, the width of the active layer can likewise be reproduced with great precision. It is also advantageous that, due to the V-shaped etching of the regions underneath the mesa, not only is the mesa itself adapted to be passivated with an $SiO_2$ layer, but also the $SiO_2$ is deposited at the edges of the active layer. As a result of this deposition, the lateral fundamental mode of the optical emission dominates up to stripe widths of the active layer of a few µm.

Further, $SiO_2$ bridges between the cover layer and the buffer layer, which function to stabilize the mesa mechanically to an adequate degree without further measures, are also formed at the mesa edges during the passivation of the under-etched surfaces.

The resulting "mushroom" structure yields a low threshold current in continuous wave mode at room temperature and the inverted layer format yields a low series resistance. The low dissipated power achieved by these two advantages in such laser allows such a chip to have its substrate side soldered to a heat sink (such as one comprised, for example, of copper). This means a considerable simplification of assembly in comparison to the standard soldering of the epitaxial side to a heat sink. Despite the less favorable thermal coupling due to soldering at the substrate side, the temperature at the p-n junction, and, thus, the threshold current, are not noticeably increased due to the lower power dissipation.

Further, substrate-side soldering of such a laser chip is a pre-requisite for a monolithic integration of such a laser with further components.

In the Sn-In-P solution intended for the growth of the InP cover layer, the high vapor pressure of the phosphorus (P), which has a cause and effect relationship to the high solubility of P in Sn, leads to an evaporation of P, and, thus, to a reduction of the saturation temperature of such solution. As a consequence of this P loss, the relationship x(P) > x(In) exists in the solution, so that the known phase diagram for an InP-Sn solution wherein x(P) = x(In) (where x denotes the atomic fraction of the corresponding element in the solution) is no longer applicable. By determining the phase diagram of the system Sn-In-P, and by measuring the evaporation losses of P as a function of the temperature, however, the composition and the saturation temperature of a given Sn-In-P solution can be precisely identified during the initial homogenization (melt formation) and during the growth of the InP cover layer.

In general, to practice the present process for producing a double hetero-structure for use in a laser device or in a light emitting diode device, one practices in a hydrogen atmosphere the successive steps of:

(A) epitaxially growing a buffer layer comprised of p-doped indium phosphide upon a substrate comprised of crystalline (100)-oriented p-doped indium phosphide, (B) epitaxially growing an active layer selected from the group consisting of indium gallium arsenide phosphide and indium gallium arsenide upon said buffer layer, and (C) epitaxially growing a cover layer comprised of n-doped indium phosphide upon said active layer from a solution of Sn-In-P.

Preferably, the Sn-In-P solution is super-saturated with indium phosphide to an extent sufficient to account for the predetermined rate of phosphorous evaporation from said solution at a predetermined temperature, that is, a temperature in the range to be used for layer production in accord with the invention.

When producing a structure having an active layer consisting of InGaAsP, the buffer layer is preferably grown by exposing the indicated substrate to a first solution comprised of p-doped In-P. Preferably, growth from such first solution is performed at a temperature ranging from about 520° to 501° C. A second solution is comprised of undoped In-Ga-As wherein preferably equal atomic fractions of gallium and arsenic are initially present. Such second solution is saturated with phosphorus evaporating from a third solution comprised of Sn-In-P. Then, the active layer is preferably grown on the said buffer layer from such second solution at a temperature of about 501° C. Then, the furnace is cooled to a temperature of about 473° C. Next, the cover layer is grown by exposing such active layer to such a third solution which is maintained at a temperature of about 473° C.

When producing a structure having an active layer consisting of InGaAs a two-step epitaxial process is preferably utilized. In a first such epitaxial process, the buffer layer and the active layer are each successively grown from respective solutions contained in adjacent chambers of a multi-chambered crucible. This first epitaxial process step being conducted at a temperature ranging from about 500° to 650° C. After exchanging the solutions, in a second such epitaxial process, the cover layer is separately grown at a temperature of about 473° C. using such a solution of Sn-In-P.

It is presently preferred when practicing the present invention to produce a buffer layer which has a thickness ranging from about 0.5 to 3 $\mu$m, a light active layer which has a thickness ranging from about 0.1 to 0.5 $\mu$m (but see specific teachings in the Examples below), and a cover layer which has a thickness in the range from about 1 to 3 $\mu$m.

EMBODIMENTS

The present invention is further illustrated by reference to the following examples. Those skilled in the art will appreciate that other and further embodiments are obvious and within the spirit and scope of this invention from the teachings of these present examples taken with the accompanying specification.

EXAMPLE 1

The production of an inventive InGaAsP layer containing structure (for a laser or a LED) is now described:

The solutions from which the individual layers are grown in this example are situated in the chambers of a horizontal multi-chamber crucible. All chambers are upwardly closed by graphite covers. The flow velocity of the H$_2$ atmosphere amounts to 0.5 cm/s.

A Zn-doped In-P solution is in the first chamber of a sliding crucible. In the second (adjacent) chamber there is an undoped In-Ga-As melt solution containing equal parts of Ga and As with x(Ga)=x(As)=1.13% which corresponds to a saturation temperature of 505° C. in equilibrium with In$_{0.53}$Ga$_{0.47}$As. The third chamber is empty. The fourth chamber is filled with a solution of 18.5 mg InP per each 1 g of Sn. The furnace is initially heated to a temperature of 540° C. in order to achieve a homogenization of the solutions. It turns out that a homogenizing pre-heating time of only 30 minutes is appropriate. This brief time interval is selected for reasons of producing the least possible P evaporation loss from the Sn-In-P solution. Nonetheless, this time interval is sufficiently long to guarantee a very uniform thickness of all three epitaxial layers.

After this pre-heating time, and after the furnace is cooled to about 520° C., the substrate is brought under the first chamber and the buffer layer is grown, beginning at a temperature of about 520° C. and cooling down to a temperature of about 501° C. Then, the resulting coated substrate is shifted under the second chamber, and the active layer is grown at a constant temperature of 501° C. In order to obtain an InGaAsP layer, it is not necessary to add P to the In-Ga-As solution, since a saturation of the In-Ga-As melt with P ensues due to the evaporating P from the fourth chamber.

In the next step, the substrate is brought under the empty third chamber and the furnace temperature is lowered to 473° C. Next, the substrate is shifted under the fourth chamber with the Sn-In-P solution, and the growth of the InP cover layer begins. The cooling rate of the furnace amounts to 10° C./h. A layer thickness of 1.5 $\mu$m is achieved within 2 minutes, but a layer thickness of 0.13 $\mu$m has already grown after the first second. The saturation temperatures of this solution are 478.8° C. before the pre-heating, 478.0° C. after the pre-heating, and 476.5° C. after the epitaxial process.

FIG. 2 shows light-current characteristics at various temperatures of an InGaAsP/InP laser produced in such fashion wherein the "mushroom" structure has been used. This laser emits at a wavelength ($\lambda$) of about 1.54 m.

In this example, the threshold current in continuous wave mode at room temperature amounts to I$_{th}$=78 mA, the threshold current density amounts to j$_{th}$=11.9 kA/cm$^2$, the external differential efficiency per facet amounts to $\eta$=0.08 W/A per mirror, and the temperature sensitivity amounts to T$_o$=53 K. Light powers per facet up to about 4 mW in continuous wave mode can be achieved without difficulty. The dimensions of the active volume d,s and L are likewise indicated in FIG. 2.

FIG. 3 shows the emission spectrum of the same InGaAsP/InP laser given an injection current of 15% above the threshold current and an output power of P =0.8 mW per facet. The laser oscillates close to $\lambda$=1.54 $\mu$m in the lateral fundamental mode in only a few axial modes. The mode wavelength spacing amounts to $\Delta\lambda$=1.32 nm.

EXAMPLE 2

In order to manufacture an InGaAs/InP structure for a laser or a LED, it is fundamentally sufficient to close the chambers of the sliding crucible that contain the Sn-In-P solution, or, alternatively, the In-Ga-As solution, gas-tight. Such a seal, however, is difficult to realize, so that it is more practical to divide the epitaxial growth process into two steps.

In the first step, the buffer layer and the active layer are preferably grown, whereby there is no Sn-In-P solution in the furnace. For this reason, the growth temperature of the two layers can be elevated from about 500° C. to 600° C. through 650° C., since the evaporation of P from the closed In-P solution is negligible, and, thus, no contamination of the In-Ga-As solution with P can occur. Thereafter, after the furnace has cooled, the Zn-doped In-P solution and the In-Ga-As solution are replaced by the Sn-In-P solution, and the cover layer is grown with the same temperature program as described above in the manufacture of the InGaAsP/InP structure.

FIG. 4 shows light-current characteristics of an InGaAs/InP laser produced in this fashion whereby the "mushroom" structure has likewise been employed and such product laser emits at $\lambda = 1.65$ μm. The threshold current in continuous wave mode at room temperature of this example amounts to $I_{th} = 40$ mA corresponding to a threshold current density of $j_{th} = 8.0$ kA/cm$^2$. The external differential efficiency of the characteristic amounts to $\eta = 0.10$ W/A per facet and the temperature sensitivity is $T_o = 40$ K.

Since the thickness of the active layer of $d = 0.28$ μm in this example is still too high a further reduction of $I_{th}$ and $j_{th}$ can be expected given a lower d. Nonetheless, these identified values of $I_{th}$ and $j_{th}$ are already the equal of those of ternary lasers with anti-meltback layer and BH-structure of the current state of the art. It is definitely clear that the interruption of the epitaxy applied here at the boundary surface from active layer to cover layer and the employment of an extremely highly Sn-doped cover layer deposited from an Sn-In-P solution cause no significant increase in the threshold current density.

Further, FIG. 4 shows the current-voltage characteristic of this laser, this comprising a bend at about 0.75 V in accord with the energy gap of InGaAs ($E_g = 0.75$ eV) and a very low ohmic resistance of 0.9 Ω. This value is significantly lower than that of a ternary laser on an n-doped substrate with BH-structure ($\sim 7\Omega$) for which a total of six epitaxial layers are required, but which otherwise exhibits comparable values of threshold current and of external differential efficiency.

FIG. 5 shows the emission spectrum of the InGaAs/InP laser of FIG. 4 given an injection current of 20% above the threshold current and an output power of P = 0.8 mW per facet. The laser oscillates close to $\lambda = 1.65$ μm in the lateral fundamental mode, and, just like the InGaAsP/InP laser, oscillates in only a few axial modes. The mode wavelength spacing amounts to $\Delta\lambda = 1.325$ nm.

An examination of both laser types of Examples 1 and 2 in a scanning electron microscope showed that the cover layer has grown nearly meltback-free on the active layer. The roughness of this InGaAsP/InP interface or, alternatively, this InGaAs/InP interface, was identified at less than 20 nm. This roughness is thus only less than or equal to about 10% of the optimum thickness of the active layer of about 0.2 μm.

As is apparent from the foregoing specification, the invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim:

1. In a method for the production of double heterostructure lasers and light emitting diodes for the wavelength range from about 1.2 to 1.7 microns having either a quaternary active layer of InGaAsP, or, alternatively, a ternary active layer of InGaAs by means of liquid phase epitaxy, the improvement which comprises constructing such a laser or light emitting diode structure on a (100)-oriented crystalline p-doped indium phosphide substrate without an anti-meltback layer, such structure having at least three layers each epitaxially and lattice-matched grown, a first such layer being a p-doped indium phosphide buffer layer, a second layer being an indium gallium arsenide phosphide or indium gallium arsenide active layer, and a third layer being an n+-doped indium phosphide cover layer and wherein said n+-doped indium phosphide layer is deposited from an Sn-In-P solution.

2. The method of claim 1 wherein the evaporation loss of phosphorus from said Sn-In-P solution during the prebake time and during the epitaxial process is taken into consideration in forming said solution and in identifying the saturation temperature of said solution.

3. The method of claim 2 wherein said solution is super-saturated with indium phosphide.

4. The method of claim 1 wherein the growth of the respective three said layers ensues from a multi-chambered crucible in succession in only one epitaxial growth process at lowest possible temperatures.

5. The method of claim 4 wherein said first layer is grown in a temperature range from about 520° C. to 501° C., said second layer is grown at a temperature of about 501° C., and, after a cooling time interval during which said substrate is not exposed to any solution, said third layer is grown at a temperature of about 473° C.

6. The method of claim 5 wherein said second layer comprises indium gallium arsenide, and each of the chambers of said crucible which contain the solutions is closed gas-tight.

7. The method of claim 1 wherein, in a first epitaxial growth process, only a p-doped In-P solution and an In-Ga-As solution are situated in a multi-chambered crucible, and a p-doped indium phosphide buffer layer and an active indium gallium arsenide layer are each successively grown; and wherein, after these solutions have been replaced by a Sn-In-P solution, an n-doped indium phosphide cover layer is grown in a second epitaxial growth process.

8. The method of claim 7, wherein said first epitaxial growth process occurs at a temperature in the range from about 500° to 650°0 C. and said second epitaxial growth process occurs at a temperature of about 473° C.

9. The method of claim 1 wherein characterized in that such resulting double hetero-structure is shaped into a mushroom structure laser or light emitting diode in a subsequent multistage etching process.

10. The method of claim 9 wherein the under-etched surfaces of such resulting mushroom structure are passivated with $SiO_2$.

11. The method of claim 10 wherein such resulting laser or LED is applied to a heat sink using its said substrate side.

12. A process for producing a double hetero-structure for use in a laser device or in a light emitting diode device, said process comprising the successive steps of:
 (A) epitaxially growing a buffer layer comprised of p-doped indium phosphide upon a substrate comprised of crystalline (100)-oriented p-doped indium phosphide, (B) epitaxially growing an active layer having a composition selected from the group consisting of indium gallium arsenide phosphide and indium gallium arsenide upon said buffer layer, and (C) epitaxially growing a cover layer comprised of n-doped indium phosphide upon said active layer, from a solution of Sn-In-P, said steps (A), (B) and (C) being carried out in a hydrogen atmosphere.

13. The process of claim 12 wherein said Sn-In-P solution is super-saturated with indium phosphide to an extent sufficient to account for the predetermined rate of phosphorus evaporation from said solution at a predetermined temperature.

14. The process of claim 12 wherein said buffer layer is so grown by exposing said substrate to a first solution comprised of p-doped In-P which said first solution is maintained at a temperature ranging from about 520° to 501° C.

15. The process of claim 12 wherein said active layer is so grown by exposing said buffer layer to a second solution comprised of an undoped In-Ga-As composition wherein equal atomic fractions of gallium and arsenic are initially present which said second solution is maintained at a temperature of about 501° C., and thereafter the furnace is cooled to a temperature of about 473° C.

16. The process of claim 15 wherein during said exposure, an Sn-In-P solution is nearby, thereby to saturate said second melt solution with phosphorus.

17. The process of claim 12 wherein said cover layer is so grown by exposing said active layer to a third solution comprised of Sn-In-P which is maintained at a temperature of about 473° C.

18. The process of claim 12 wherein, in a first epitaxial process, said buffer layer and said active layer are each successively grown by progressive exposure to respective solutions contained in adjacent chambers of a multi-chambered crucible, said first epitaxial growth process being conducted at a temperature ranging from about 600° to 650° C., and said active layer consists of indium gallium arsenide, and, thereafter, in a second epitaxial growth process, said cover layer is separately grown at a temperature of about 473° C.

* * * * *